(12) United States Patent
Li

(10) Patent No.: US 11,101,381 B2
(45) Date of Patent: Aug. 24, 2021

(54) STRUCTURE OF HIGH VOLTAGE TRANSISTOR AND METHOD FOR FABRICATING THE SAME

(71) Applicant: United Microelectronics Corp., Hsinchu (TW)

(72) Inventor: Shin-Hung Li, Nantou County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 70 days.

(21) Appl. No.: 16/601,364

(22) Filed: Oct. 14, 2019

(65) Prior Publication Data
US 2021/0074843 A1 Mar. 11, 2021

(30) Foreign Application Priority Data
Sep. 5, 2019 (TW) .................................. 108132051

(51) Int. Cl.
*H01L 29/78* (2006.01)
*H01L 21/762* (2006.01)
*H01L 29/06* (2006.01)
*H01L 29/66* (2006.01)

(52) U.S. Cl.
CPC .... *H01L 29/7809* (2013.01); *H01L 21/76224* (2013.01); *H01L 29/0653* (2013.01); *H01L 29/66712* (2013.01)

(58) Field of Classification Search
CPC .......... H01L 29/7809; H01L 29/66712; H01L 29/0653; H01L 21/76224; H01L 29/66659; H01L 29/7835; H01L 29/78624
See application file for complete search history.

(56) References Cited

U.S. PATENT DOCUMENTS

| | | | |
|---|---|---|---|
| 5,753,561 A | 5/1998 | Lee et al. | |
| 6,153,478 A | 11/2000 | Lin et al. | |
| 6,194,772 B1 | 2/2001 | Tung | |
| 8,115,253 B2 | 2/2012 | Tang et al. | |
| 8,815,703 B2 | 8/2014 | Huang et al. | |
| 9,406,771 B1 | 8/2016 | Hsiao et al. | |
| 9,583,617 B2 | 2/2017 | Hsiao et al. | |
| 10,276,710 B1 | 4/2019 | Li et al. | |
| 10,297,455 B2 | 5/2019 | Hsiao et al. | |
| 2009/0065890 A1* | 3/2009 | Choi ............... | H01L 21/823462 257/501 |
| 2013/0043513 A1* | 2/2013 | Huang .............. | H01L 21/76232 257/288 |
| 2016/0056233 A1* | 2/2016 | Mitsuiki ......... | H01L 21/823418 257/401 |

* cited by examiner

*Primary Examiner* — Steven H Loke
*Assistant Examiner* — Juanita B Rhodes
(74) *Attorney, Agent, or Firm* — J.C. Patents

(57) ABSTRACT

A structure of a high voltage transistor includes a substrate. A gate insulating layer is disposed on the substrate. A shallow trench isolation structure is formed in the substrate adjacent to the gate insulating layer. The shallow trench isolation structure includes a first sidewall and a second sidewall. A top portion of the first sidewall merges with a side region of the gate insulating layer. A bottom surface of the shallow trench isolation structure is gradually decreasing in depth from the second sidewall to the first sidewall. A source/drain region is formed in the substrate at a side of the gate insulating layer and surrounding the shallow trench isolation structure.

18 Claims, 8 Drawing Sheets

STRUCTURE OF HIGH VOLTAGE TRANSISTOR AND METHOD FOR FABRICATING THE SAME

CROSS-REFERENCE TO RELATED APPLICATION

This application claims the priority benefit of Taiwan application serial no. 108132051, filed on Sep. 5, 2019. The entirety of the above-mentioned patent application is hereby incorporated by reference herein and made a part of this specification.

BACKGROUND OF THE INVENTION

1. Field of the Invention

The invention relates to a semiconductor fabrication technology, in particular, to a structure of a high voltage transistor and a method for fabricating the same.

2. Description of Related Art

For application of more functions of electronic products, an operating voltage of a transistor formed by a semiconductor is not limited to a general low operating voltage anymore. That is, the transistor may also be operated within a high voltage range for some functions.

For a structure of a high voltage transistor, a gate insulating layer thereof requires a relatively great thickness for isolation of a gate, and shallow trench isolation structures are also additionally disposed at two ends of the gate insulating layer. In addition, high voltage source/drain regions at two sides of the gate may surround the shallow trench isolation structures. When the high voltage transistor is operated, a drift current may flow through a bottom portion and sidewall of the shallow trench isolation structure and enter a channel region below the gate.

For such a structure of the high voltage transistor, a path of the drift current turns for many times, so it is hard to maintain a high current, and it is likely to form corona discharge at a sharp part on the bottom portion of the shallow trench isolation structure to further interfere with flowing of the drift current.

Quality of a drift current may affect operation of a high voltage transistor. How to design a structure of a high voltage transistor to improve quality of a drift current is one of subjects that need to be considered in research and development.

SUMMARY OF THE INVENTION

The invention relates to a structure of a high voltage transistor and a method for fabricating the same. Shallow trench isolation may be improved to at least effectively improve the quality of a drift current and thus improve the operating performance of the high voltage transistor.

In an embodiment, the invention provides a structure of a high voltage transistor, which includes a substrate. A gate insulating layer is disposed on the substrate. A shallow trench isolation structure is formed in the substrate adjacent to the gate insulating layer. The shallow trench isolation structure includes a first sidewall and a second sidewall. A top portion of the first sidewall merges with a side region of the gate insulating layer. A bottom surface of the shallow trench isolation structure is gradually decreasing in depth from the second sidewall to the first sidewall. A source/drain region is formed in the substrate at a side of the gate insulating layer and surrounding the shallow trench isolation structure.

In an embodiment, the structure of the high voltage transistor further includes a gate layer disposed on the gate insulating layer and a contact doped region disposed in the substrate at a top portion of the source/drain region.

In an embodiment, for the structure of the high voltage transistor, the bottom surface of the shallow trench isolation structure is smoothly gradually decreasing in depth.

In an embodiment, for the structure of the high voltage transistor, the bottom surface of the shallow trench isolation structure includes no sharp protruding structure.

In an embodiment, for the structure of the high voltage transistor, a top portion of the shallow trench isolation structure further includes a depressed structure bonded to the side region of the gate insulating layer.

In an embodiment, for the structure of the high voltage transistor, a depth of the source/drain region below the first sidewall of the shallow trench isolation structure is greater than a depth of the source/drain region below the second sidewall of the shallow trench isolation structure.

In an embodiment, for the structure of the high voltage transistor, the bottom surface of the shallow trench isolation structure is an inclined surface gradually decreasing in depth from the second sidewall to the first sidewall.

In an embodiment, for the structure of the high voltage transistor, the gate insulating layer is a gate oxide layer with a thickness within a range and is configured to isolate the gate layer on the gate oxide layer under high voltage operation.

In an embodiment, the invention provides a method for fabricating a high voltage transistor. The method includes: providing a substrate, a middle region and a peripheral region adjacent to the middle region being laid out on the substrate; forming a gate insulating layer on the middle region on the substrate; forming a shallow trench isolation structure on the peripheral region in the substrate adjacent to the gate insulating layer, the shallow trench isolation structure including a first sidewall and a second sidewall, a top portion of the first sidewall merging with a side region of the gate insulating layer and a bottom surface of the shallow trench isolation structure being gradually decreasing in depth from the second sidewall to the first sidewall; and forming a source/drain region in the substrate at a side of the gate insulating layer and surrounding the shallow trench isolation structure.

In an embodiment, the method for fabricating the high voltage transistor further includes: forming a gate layer on the gate insulating layer, and forming a contact doped region in the substrate at a top portion of the source/drain region.

In an embodiment, for the method for fabricating the high voltage transistor, the step of providing the substrate includes patterning the substrate to form a sunken structure in height in the peripheral region. An edge of the sunken structure includes an interfacial surface relative to the middle region. The interfacial surface is gradually decreasing in height in a direction from the middle region to the peripheral region.

In an embodiment, for the method for fabricating the high voltage transistor, an isotropic etching procedure or a procedure for liner oxidation with cleaning is implemented to obtain the interfacial surface.

In an embodiment, for the method for fabricating the high voltage transistor, the step of forming the shallow trench isolation structure includes patterning the substrate to obtain a shallow trench located on the interfacial surface between the middle region and the peripheral region. With formation of the interfacial surface of the substrate, a bottom surface of the shallow trench is gradually decreasing in depth towards the middle region.

In an embodiment, for the method for fabricating the high voltage transistor, a bottom surface of the shallow trench isolation structure is smoothly gradually decreasing in depth.

In an embodiment, for the method for fabricating the high voltage transistor, the bottom surface of the shallow trench isolation structure includes no sharp protruding structure.

In an embodiment, for the method for fabricating the high voltage transistor, a top portion of the shallow trench isolation structure further includes a depressed structure bonded to the side region of the gate insulating layer.

In an embodiment, for the method for fabricating the high voltage transistor, a method for forming the depressed structure of the shallow trench isolation structure includes: forming a mask layer to cover a side portion of the shallow trench isolation structure, the mask layer and the side portion being opposite to the gate insulating layer; and etching a portion, exposed from the mask layer, of the shallow trench isolation structure to reduce a height of the shallow trench isolation structure.

In an embodiment, for the method for fabricating the high voltage transistor, a depth of the source/drain region below the first sidewall of the shallow trench isolation structure is greater than a depth of the source/drain region below the second sidewall of the shallow trench isolation structure.

In an embodiment, for the method for fabricating the high voltage transistor, the bottom surface of the shallow trench isolation structure is an inclined surface gradually decreasing in depth from the second sidewall to the first sidewall.

In an embodiment, for the method for fabricating the high voltage transistor, the gate insulating layer is a gate oxide layer with a thickness within a range and is configured to isolate the gate layer on the gate oxide layer under high voltage operation.

In order to make the aforementioned and other objectives and advantages of the present invention comprehensible, embodiments accompanied with figures are described in detail below.

DESCRIPTION OF THE EMBODIMENTS

The invention provides a structure of a high voltage transistor and a method for fabricating the same. According to the invention, shallow trench isolation is designed in such a manner that a bottom portion thereof has a gradually decreasing depth to at least effectively improve the quality of a drift current and thus improve the operating performance of the high voltage transistor.

A plurality of embodiments is provided below to describe the invention, but the invention is not limited to the embodiments. The embodiments can also be combined properly.

Figure 1:
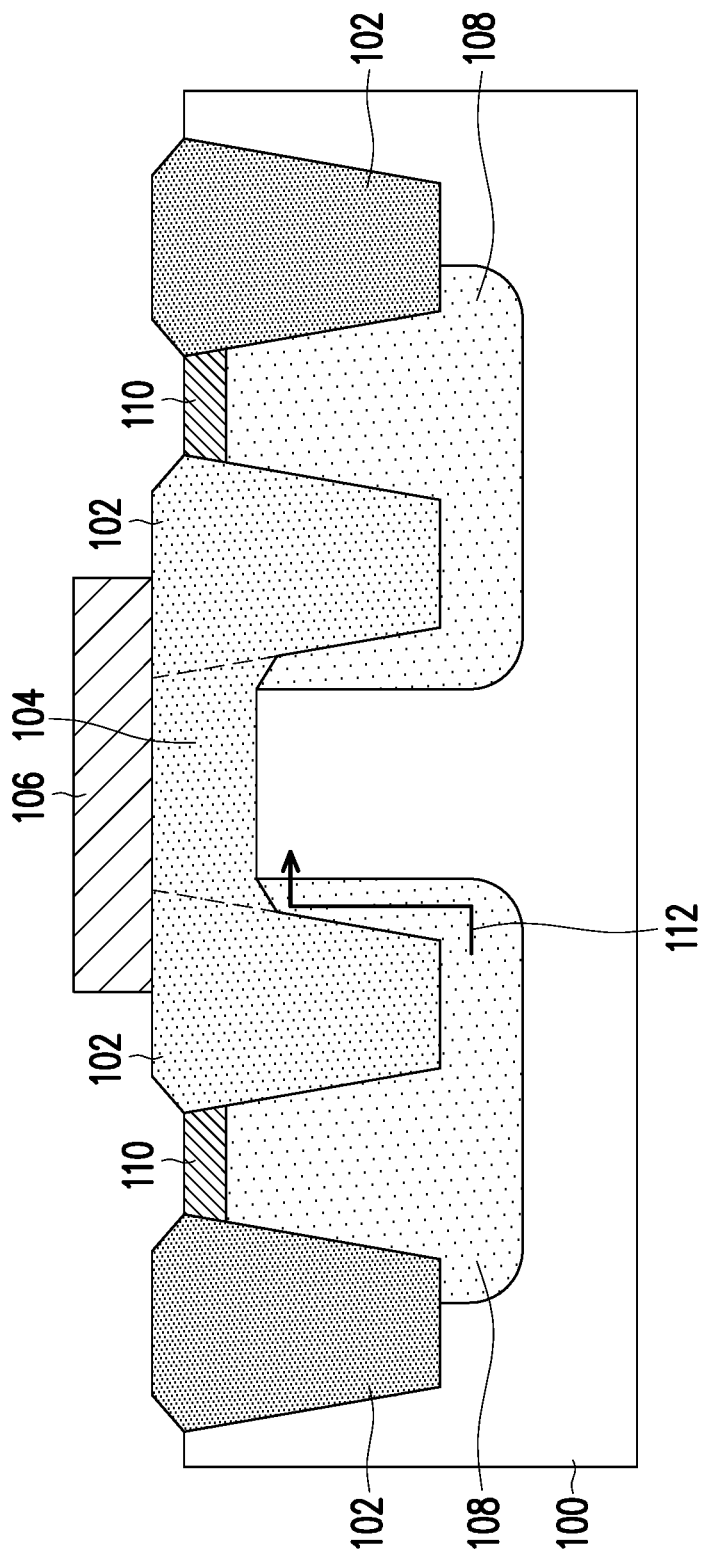
FIG. 1 is a schematic diagram of a structure of a high voltage transistor according to an embodiment of the invention.

FIG. 1 is a schematic diagram of a structure of a high voltage transistor according to an embodiment of the invention. In the invention, referring to FIG. 1, the operating performance of a structure of a high voltage transistor is looked into, and an improved structural design is further proposed. The structure of the high voltage transistor of the invention is fabricated on a substrate 100. A shallow trench isolation structure 102 may be formed on the substrate at first. The shallow trench isolation structure 102 is usually configured to isolate the transistor. A basic structure of the high voltage transistor also includes a gate insulating layer 104 on the substrate 100. A gate layer 106 is disposed on the gate insulating layer 104. Since the transistor is operated at a high voltage, a thickness of the gate insulating layer 104 is relatively great and the gate layer 106 may be effectively isolated under high voltage operation. Doped regions are also formed in the substrate 100 on two sides of the gate layer 104 as source/drain regions 108. A contact doped region 110 with a relatively high doping concentration is also formed at a top portion of the source/drain region 108. The shallow trench isolation structure 102 at an outer side is usually configured to isolate the transistor.

However, for the high voltage transistor, the shallow trench isolation structure 102 may also be formed in the source/drain region 108 and merges with the gate insulating layer 104 to implement isolation under high voltage operation. Due to the shallow trench isolation structure 102 in the source/drain region 108, a drift current planned to flow through a channel region, for example, a path 112, may pass through a bottom portion of the shallow trench isolation structure 102 at first. Therefore, a space of the source/drain region 108 is occupied by the shallow trench isolation structure 102 to reduce the drift current. In addition, a sharp protruding structure at the bottom portion of the shallow trench isolation structure 102 is also likely to form corona discharge and further affect the quality of the drift current and reduce the efficiency of the high voltage transistor.

After a mechanism of the high voltage transistor in FIG. 1 is looked into, the invention discloses a structure of the high voltage transistor to at least effectively improve the quality of the drift current and improve the efficiency of the high voltage transistor.

Figure 2:
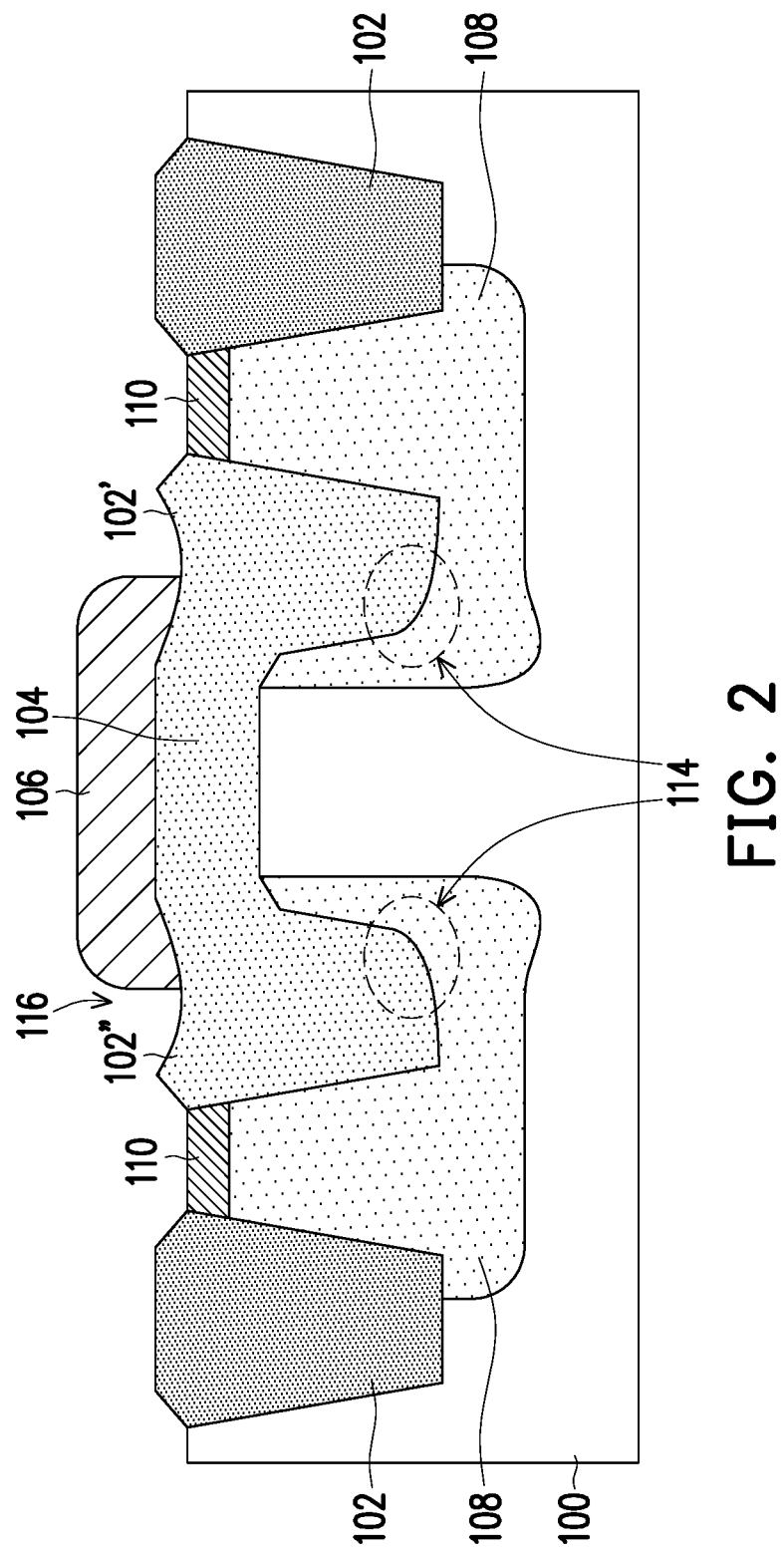
FIG. 2 is a schematic diagram of a structure of a high voltage transistor according to an embodiment of the invention.

FIG. 2 is a schematic diagram of a structure of a high voltage transistor according to an embodiment of the invention. Referring to FIG. 2, a further improved structure of a high voltage transistor of the invention is described at first. The high voltage transistor is formed on a substrate 100. A gate insulating layer 104 is disposed on the substrate 100. Shallow trench isolation structures 102' and 102" are formed in the substrate 100 adjacent to the gate insulating layer 104. The shallow trench isolation structures 102' and 102" include first sidewalls and second sidewalls. Here, a top portion of the first sidewall merges with a side region of the gate insulating layer 104.

It is to be noted that bottom surfaces of the shallow trench isolation structures 102' and 102" are gradually decreasing in depth from the second sidewalls to the first sidewalls, as shown in regions 114, and may be, for example, smoothly gradually decreasing surfaces and may further be, for example, inclined surfaces. Source/drain regions 108 are formed in the substrate 100 at two sides of the gate insulating layer 104 and surround the shallow trench isolation structures 102' and 102". In an embodiment, there may be a contact doped region 110 configured to connect another element at a top portion of the source/drain region 108.

A shallow trench isolation structure 102 at an outer side of the transistor is a structure usually configured to isolate an element. A plurality of shallow trench isolation structures 102, 102' and 102" may be, for example, completed at the same time in the same fabrication procedure. However, depressed structures 116 may further be correspondingly formed in top portions of the shallow trench isolation structures 102' and 102" of the source/drain regions 108. By the depressed structures 116, heights of the shallow trench isolation structures 102' and 102" may be reduced, and meanwhile, thicknesses of the shallow trench isolation structures 102' and 102" in the regions may also be reduced. In an embodiment, in a subsequent embedding procedure of forming the source/drain region 108, a bottom surface of the source/drain region 108 also correspondingly has a relatively great depth.

For the structure of the high voltage transistor shown in FIG. 2, the bottom surfaces of the shallow trench isolation structures 102' and 102" are gradually decreasing in depth, for example, as shown in the regions 114. In addition, the bottom surface of the source/drain region 108 may also correspondingly have a relatively great depth due to the depressed structure 116. Therefore, a drift current from the source/drain region 108 to a channel region below the gate layer may be effectively increased. Compared with the structure shown in FIG. 1, bottom portions of the shallow trench isolation structures 102' and 102" may also include no sharp protruding structure. The quality of the drift current is improved, and the efficiency of the high voltage transistor is also improved.

Then, fabrication of the structure of the high voltage transistor shown in FIG. 2 will be described below with some embodiments. In the invention, for obtaining structures of the bottom portions of the shallow trench isolation structures 102' and 102", smooth depressed curved surfaces are required to be formed at first in the regions where the shallow trench isolation structures 102' and 102" are predetermined to be formed in the substrate 100. FIG. 3A-FIG. 3D are schematic flowcharts of fabricating a substrate of a high voltage transistor according to an embodiment of the invention.

Figure 3A:
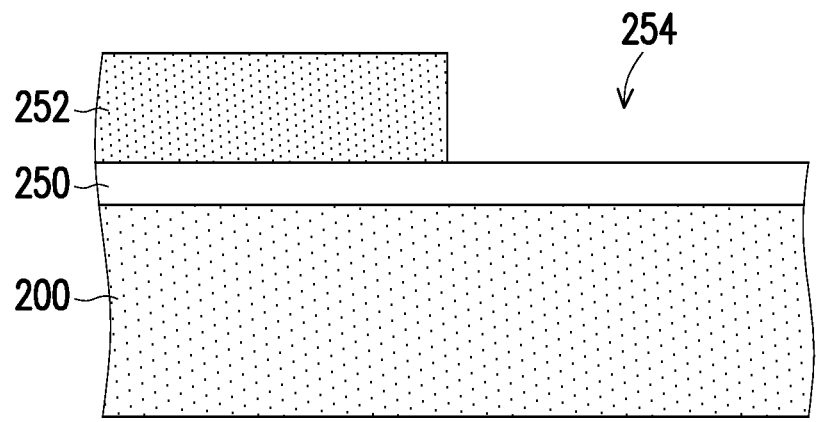
FIG. 3A-FIG. 3D are schematic flowcharts of fabricating a substrate of a high voltage transistor according to an embodiment of the invention.
Figure 3B:
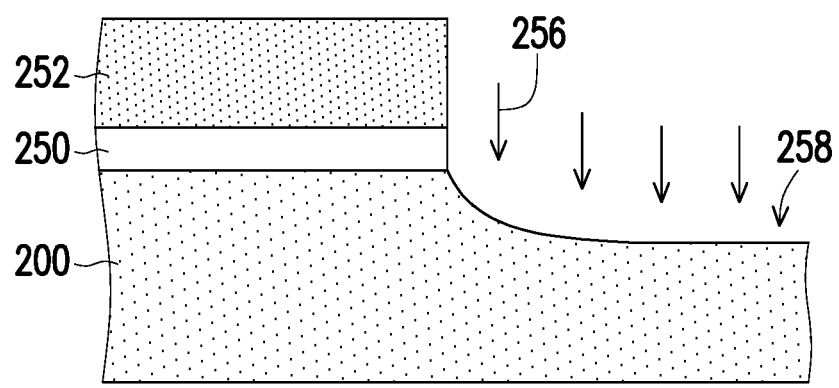

Referring to FIG. 3A, in an embodiment, a mask layer 250 and a photoresist layer 252 are formed on the substrate 200 at first. The mask layer 250 is exposed from an opening 254 of the photoresist layer 252. For a region covered by the photoresist layer 252, referring to FIG. 3B, an etching procedure 256 is implemented to etch the mask layer 250 by use of the photoresist layer 252 as an etching mask, and then a surface of the substrate 200 is also etched to obtain a sunken region 258.

For the substrate 200, the region covered by the photoresist layer 252 is a region where a gate structure is predetermined to be formed subsequently, and is also called a middle region herein. The sunken region 258 of the substrate 200 is also called a peripheral region. An interface region between the middle region and the peripheral region is where the shallow trench isolation structures 102' and 102" are predetermined to be formed.

Figure 3C:
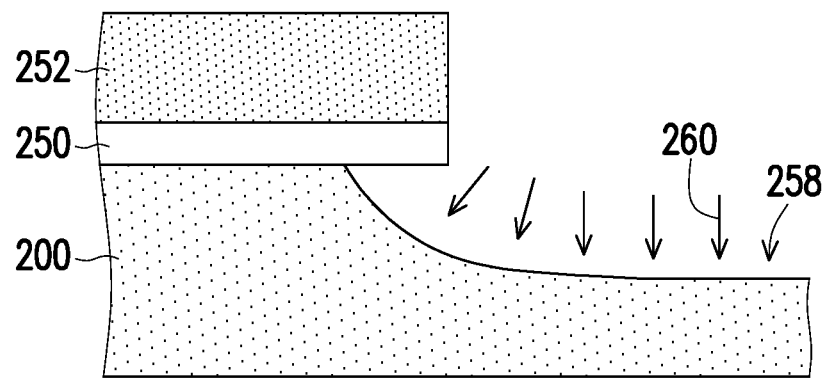

Referring to FIG. 3C, for ensuring that the shallow trench isolation structures 102' and 102" may have depth gradually decreasing structures shown as the regions 114 when being subsequently formed, the interface region between the middle region and the peripheral region is required to have the smooth sunken region 258. In an embodiment, after the photoresist layer 252 is removed, an anisotropic etching procedure 260 is implemented to further etch the substrate 200 to obtain a better smooth sunken region 258. The anisotropic etching procedure 260 is, for example, wet etching. However, the anisotropic etching procedure 260 is not the only choice, and another manner may also be adopted instead. In an embodiment, referring to FIG. 3D, a procedure 262 for liner oxidation with cleaning may also be implemented to further form a better smooth sunken region 258 of the substrate 200. Thin-layer oxidation may be implemented on the substrate 200 to obtain a liner oxide layer by a liner oxidation step, and then the liner oxide layer is removed by a subsequent cleaning step.

In an embodiment, by a smooth curved surface at the interface region between the sunken region 258, i.e., the peripheral region, and the middle region, the smooth curved surfaces with gradually decreasing depth as shown at the regions 114 may be obtained when the shallow trench isolation structures 102' and 102" are subsequently formed.

Figure 3D:
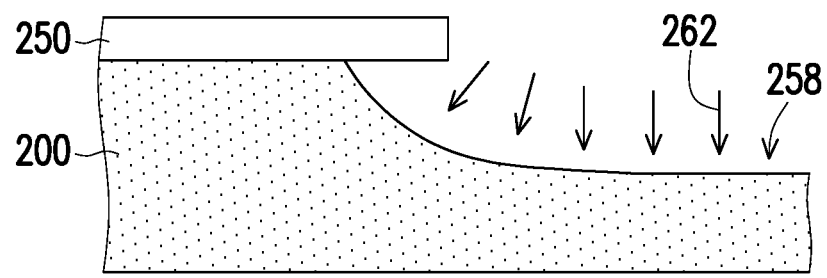

Formation of the final required shallow trench isolation structure will be described below according to the substrate 200 obtained in FIG. 3D. FIG. 4A-FIG. 4D are schematic flowcharts of fabricating a shallow trench isolation structure of a high voltage transistor according to an embodiment of the invention.

Figure 4A:
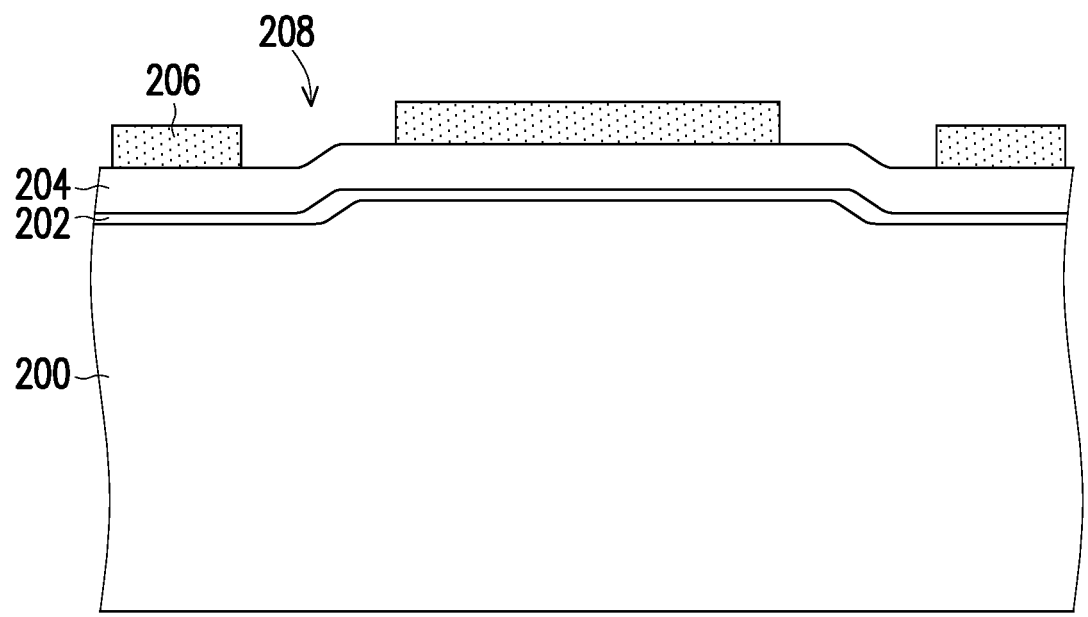
FIG. 4A-FIG. 4D are schematic flowcharts of fabricating a shallow trench isolation structure of a high voltage transistor according to an embodiment of the invention.

Referring to FIG. 4A, in an embodiment, an oxide layer 202 and a mask layer 204 are formed on the substrate 200. The oxide layer 202 is, for example, acts as a pad oxide layer. A photoresist layer 206 is formed on the mask layer 204. The photoresist layer 206 has openings 208 corresponding to the interface region between the peripheral region and middle region of the substrate 200. Regions of the openings 208 are where the shallow trench isolation structures 102' and 102" shown in FIG. 2 are predetermined to be subsequently formed.

Figure 4B:
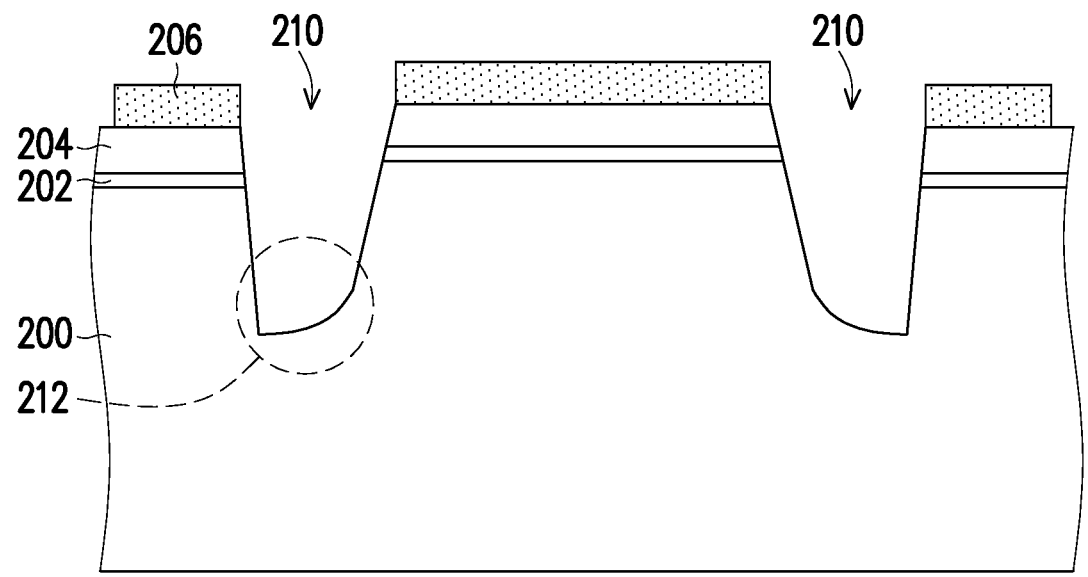

Referring to FIG. 4B, an etching procedure is implemented to form shallow trenches 210 in the substrate 200 by taking the photoresist layer 206 as an etching mask. It may be observed here that a bottom surface region 212 of the shallow trench 210 is smoothly gradually decreasing in depth in a direction from the peripheral region to the middle region.

Figure 4C:
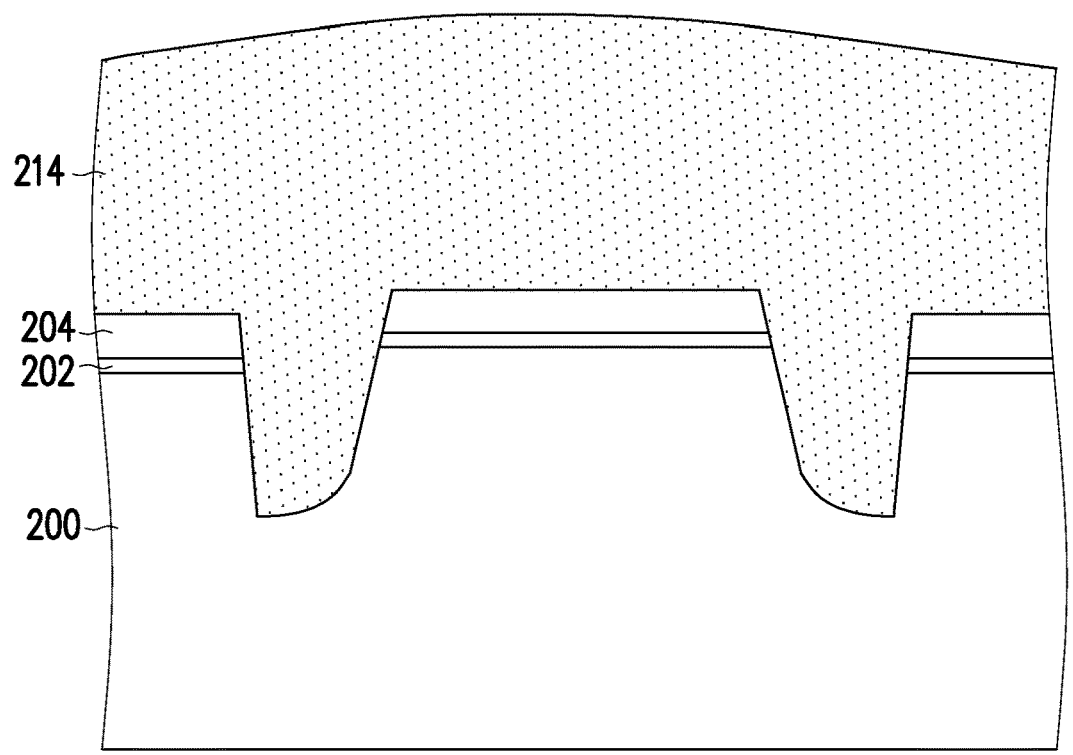
Figure 4D:
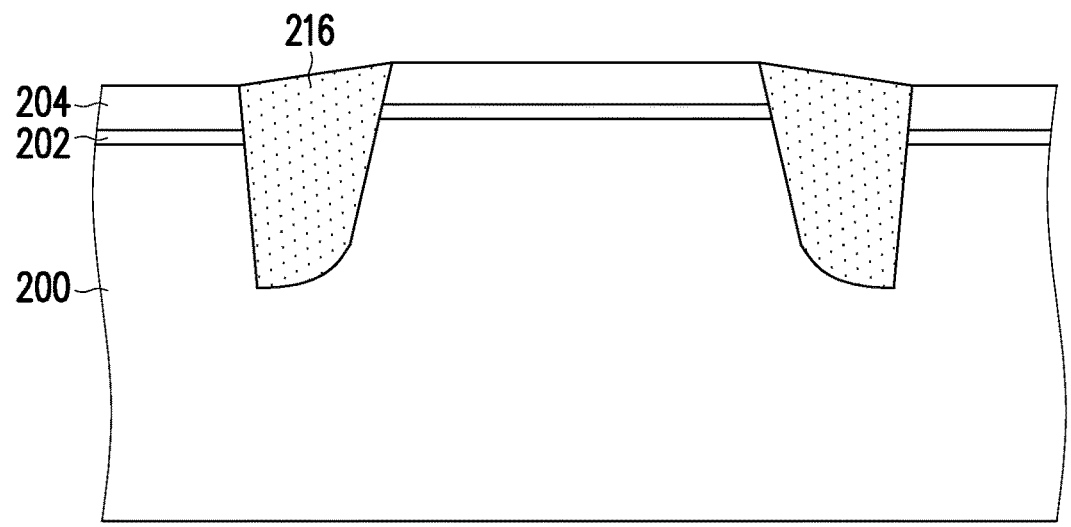

Referring to FIG. 4C, an insulating layer 214 is, for example, an oxide layer deposited on the substrate 200 and filling the shallow trenches 210. Referring to FIG. 4D, in an embodiment, a grinding procedure is implemented. The grinding procedure is, for example, stopped on the mask layer 204 and the other portion of the insulating layer 214 fills the shallow trenches 210 to form shallow trench isolation structures 216. A bottom surface of the shallow trench isolation structure 216 has formed a depth gradually decreasing structure. By such a structure, a current value of the drift current may be increased. Here, the shallow trench isolation structures 216 correspond to the shallow trench isolation structures 102' and 102" in FIG. 2. The peripheral shallow trench isolation structure 102 may be formed together. Formation of the peripheral shallow trench isolation structure 102 is not limited in an embodiment of the invention.

In an embodiment, if the depressed structures 116 at the top portions of the shallow trench isolation structures 102' and 102" are further to be formed, as shown in FIG. 2, some procedures may further be implemented. FIG. 5A-FIG. 5D are schematic flowcharts of fabricating a shallow trench isolation structure of a high voltage transistor according to an embodiment of the invention.

Figure 5A:
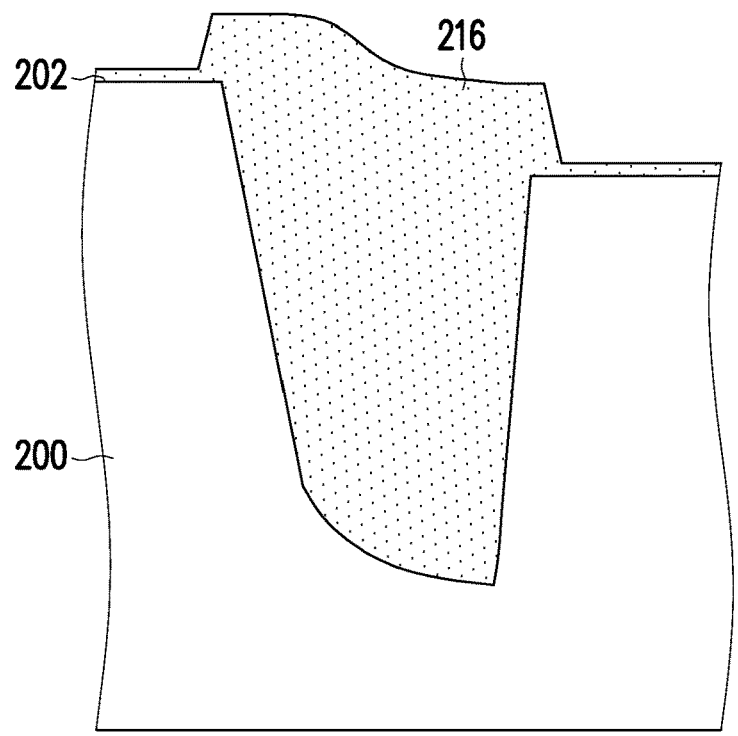
FIG. 5A-FIG. 5D are schematic flowcharts of fabricating a shallow trench isolation structure of a high voltage transistor according to an embodiment of the invention.
Figure 5B:
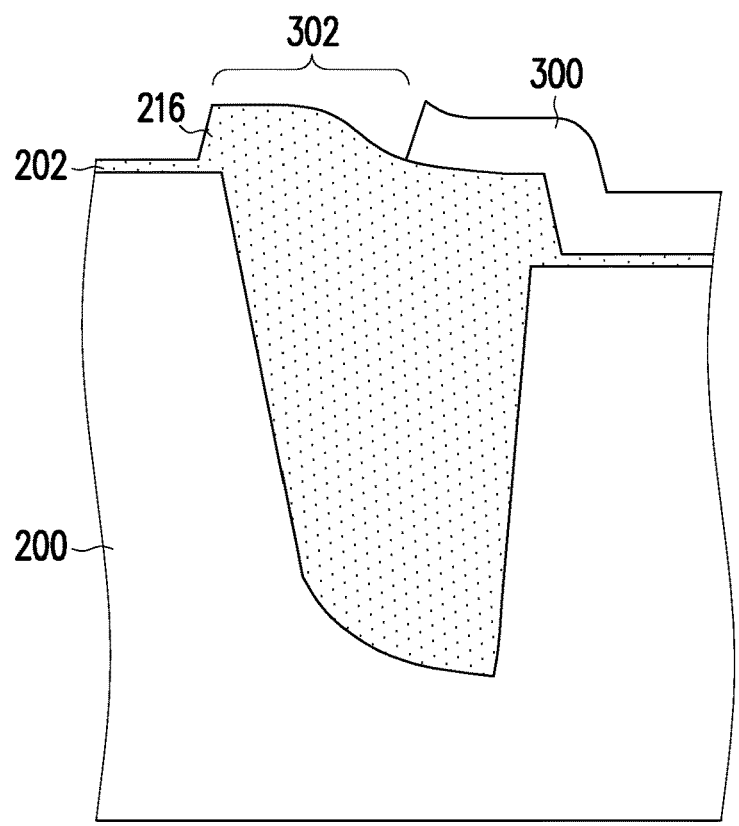
Figure 5C:
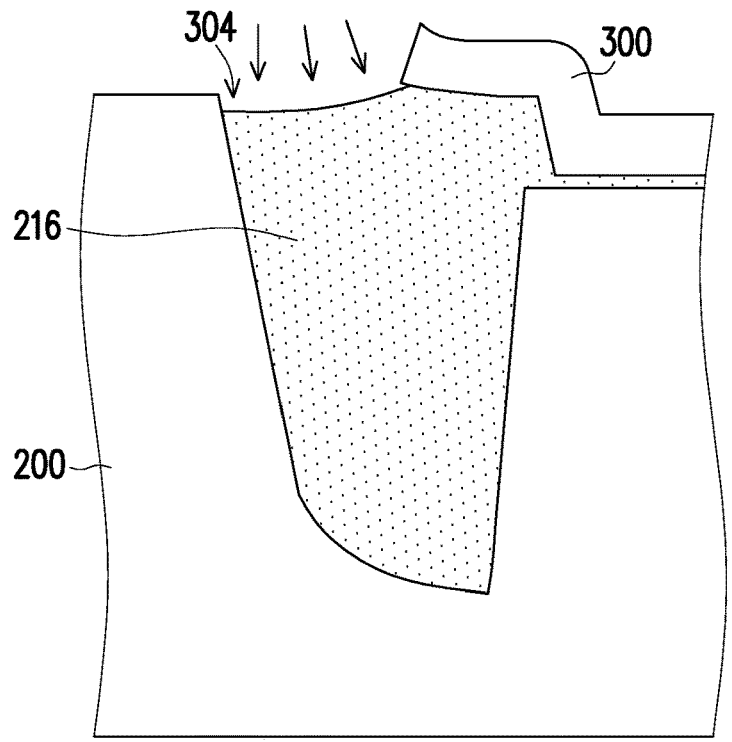

Referring to FIG. 5A, the mask layer 204 is removed. The oxide layer 202 merges with the shallow trench isolation structure 216. Referring to FIG. 5B, the mask layer 300 covers part of the oxide layer 202 and the shallow trench isolation structure 216. A region 302, close to the middle region, of the shallow trench isolation structure 216 is exposed. Referring to FIG. 5C, a portion, in the region 302, of the shallow trench isolation structure 216 is etched to form a depressed structure 304 by taking the mask layer 300 as the etching mask. In addition, part of the oxide layer 202 is also removed to expose the substrate 200.

Figure 5D:
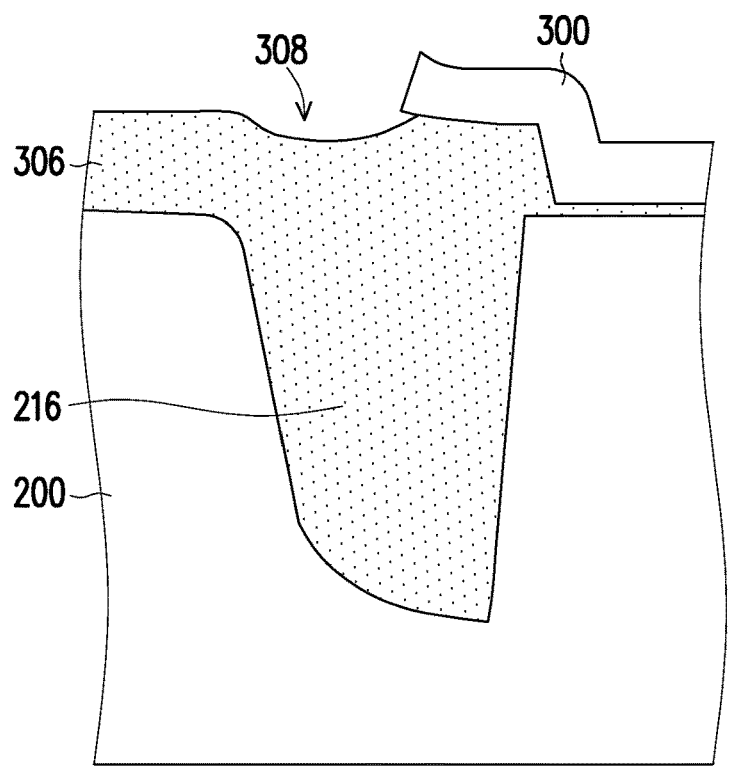

Referring to FIG. 5D, an exposed region of the substrate 200 is oxidized to obtain a gate insulating layer 306. The gate insulating layer 306 corresponds to high voltage operation and thus has a relatively great thickness. The gate insulating layer 306 may merge with the shallow trench isolation structure 216, and the depressed structure 304 of the shallow trench isolation structure 216 is also changed into a depressed structure 308. The mask layer 300 may also be subsequently removed.

Then, referring to FIG. 2 again, the source/drain regions 108 and the gate layer 106 are formed based on the shallow trench isolation structure 216 in FIG. 5D. The depressed structure 116 in FIG. 2 is formed at the depressed structure 308 of the shallow trench isolation structure 216 in FIG. 5D. Therefore, the quality of the drift current may at least be improved in the invention.

Based on the above, from a method for fabricating the high voltage transistor, the method includes that the substrate 100 is provided. The middle region and the peripheral region adjacent to the middle region are laid out on the substrate 100. The gate insulating layer 104 is formed on the middle region of the substrate 100. The shallow trench isolation structures 102' and 102" are formed on the peripheral region in the substrate adjacent to the gate insulating layer 104. The shallow trench isolation structures 102' and 102" include the first sidewalls and the second sidewalls. The top portions of the first sidewalls merge with the side region of the gate insulating layer 104. The bottom surfaces of the shallow trench isolation structures 102' and 102" are gradually decreasing in depth from the second sidewalls to the first sidewalls. The source/drain regions 108 are formed in the substrate at the side of the gate insulating layer and surrounding the shallow trench isolation structures 102' and 102".

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A structure of a high voltage transistor, comprising:
a substrate;
a gate insulating layer, disposed on the substrate;
a shallow trench isolation structure, formed in the substrate adjacent to the gate insulating layer, wherein the shallow trench isolation structure comprises a first sidewall and a second sidewall, a top portion of the first sidewall merges with a side region of the gate insulating layer, and a bottom surface of the shallow trench isolation structure is gradually decreasing in depth from the second sidewall to the first sidewall; and
a source/drain region, formed in the substrate at a side of the gate insulating layer and surrounding the shallow trench isolation structure, wherein a depth of the source/drain region below the first sidewall of the shallow trench isolation structure is greater than a depth of the source/drain region below the second sidewall of the shallow trench isolation structure.

2. The structure of the high voltage transistor according to claim 1, further comprising:
a gate layer, disposed on the gate insulating layer; and
a contact doped region, disposed in the substrate at a top portion of the source/drain region.

3. The structure of the high voltage transistor according to claim 1, wherein the bottom surface of the shallow trench isolation structure is smoothly gradually decreasing in depth.

4. The structure of the high voltage transistor according to claim 1, wherein the bottom surface of the shallow trench isolation structure comprises no sharp protruding structure.

5. The structure of the high voltage transistor according to claim 1, wherein a top portion of the shallow trench isolation structure further comprises a depressed structure bonded to the side region of the gate insulating layer.

6. The structure of the high voltage transistor according to claim 1, wherein the bottom surface of the shallow trench isolation structure is an inclined surface gradually decreasing in depth from the second sidewall to the first sidewall.

7. The structure of the high voltage transistor according to claim 1, wherein the gate insulating layer is a gate oxide layer with a thickness within a range and is configured to isolate the gate layer on the gate oxide layer under high voltage operation.

8. A method for fabricating a high voltage transistor, comprising:
providing a substrate, a middle region and a peripheral region adjacent to the middle region being laid out on the substrate, wherein the step of providing the substrate comprises:
patterning the substrate to form a sunken structure in height in the peripheral region, an edge of the sunken structure comprising an interfacial surface relative to the middle region and the interfacial surface being gradually decreasing in height in a direction from the middle region to the peripheral region;
forming a gate insulating layer on the middle region on the substrate;
forming a shallow trench isolation structure on the peripheral region in the substrate and adjacent to the gate insulating layer, wherein the shallow trench isolation structure comprises a first sidewall and a second sidewall, a top portion of the first sidewall merges with a side region of the gate insulating layer, and a bottom surface of the shallow trench isolation structure is gradually decreasing in depth from the second sidewall to the first sidewall; and
forming a source/drain region in the substrate at a side of the gate insulating layer and surrounding the shallow trench isolation structure.

9. The method for fabricating the high voltage transistor according to claim 8, further comprising:
forming a gate layer on the gate insulating layer; and
forming a contact doped region in the substrate at a top portion of the source/drain region.

10. The method for fabricating the high voltage transistor according to claim 8, wherein an isotropic etching procedure or a procedure for liner oxidation with cleaning is implemented to obtain the interfacial surface.

11. The method for fabricating the high voltage transistor according to claim 8, wherein the step of forming the shallow trench isolation structure comprises:

patterning the substrate to obtain a shallow trench located on the interfacial surface between the middle region and the peripheral region, wherein, with formation of the interfacial surface of the substrate, a bottom surface of the shallow trench is gradually decreasing in depth towards the middle region.

12. The method for fabricating the high voltage transistor according to claim 8, wherein the bottom surface of the shallow trench isolation structure is smoothly gradually decreasing in depth.

13. The method for fabricating the high voltage transistor according to claim 8, wherein the bottom surface of the shallow trench isolation structure comprises no sharp protruding structure.

14. The method for fabricating the high voltage transistor according to claim 8, wherein a top portion of the shallow trench isolation structure further comprises a depressed structure bonded to the side region of the gate insulating layer.

15. The method for fabricating the high voltage transistor according to claim 14, wherein a method for forming the depressed structure of the shallow trench isolation structure comprises:

forming a mask layer to cover a side portion of the shallow trench isolation structure, the mask layer and the side portion being opposite to the gate insulating layer; and etching a portion, exposed from the mask layer, of the shallow trench isolation structure to reduce a height of the shallow trench isolation structure.

16. The method for fabricating the high voltage transistor according to claim 8, wherein a depth of the source/drain region below the first sidewall of the shallow trench isolation structure is greater than a depth of the source/drain region below the second sidewall of the shallow trench isolation structure.

17. The method for fabricating the high voltage transistor according to claim 8, wherein the bottom surface of the shallow trench isolation structure is an inclined surface gradually decreasing in depth from the second sidewall to the first sidewall.

18. The method for fabricating the high voltage transistor according to claim 8, wherein the gate insulating layer is a gate oxide layer with a thickness within a range and is configured to isolate the gate layer on the gate oxide layer under high voltage operation.

* * * * *